United States Patent
Henninger

[11] Patent Number: 5,517,128
[45] Date of Patent: May 14, 1996

[54] METHOD AND ARRANGEMENT FOR CHARGE CARRIER PROFILING IN SEMICONDUCTOR STRUCTURE BY MEANS OF AFM SCANNING

[75] Inventor: Uwe Henninger, Berlin, Germany

[73] Assignee: Sentech Instruments GmbH, Germany

[21] Appl. No.: 236,691

[22] Filed: Apr. 29, 1994

Related U.S. Application Data

[63] Continuation-in-part of Ser. No. 177,674, Jan. 5, 1994, abandoned.

[30] Foreign Application Priority Data

Jan. 5, 1993 [DE] Germany .......................... 43 00 504.9

[51] Int. Cl.[6] .................................................. G01R 29/12
[52] U.S. Cl. ........................................ 324/765; 324/158.1
[58] Field of Search .............................. 324/96, 757, 765, 324/158.1, 73.1; 250/306, 307, 432 F; 73/105, 106; 369/126

[56] References Cited

U.S. PATENT DOCUMENTS

| | | | |
|---|---|---|---|
| 4,532,422 | 7/1985 | Nomura et al. | 250/306 |
| 4,941,753 | 7/1990 | Wickramasinghe | 324/158 D |
| 5,055,679 | 10/1991 | Ninomiya et al. | 250/306 |
| 5,065,103 | 11/1991 | Slinkman et al. | 324/458 |
| 5,237,859 | 8/1993 | Elings et al. | 73/105 |
| 5,245,863 | 9/1993 | Kajmura et al. | 73/105 |
| 5,255,259 | 10/1993 | Hatanaka et al. | 369/126 |
| 5,267,471 | 12/1993 | Abraham et al. | 73/105 |
| 5,299,184 | 3/1994 | Yamano et al. | 369/126 |

*Primary Examiner*—Vinh P. Nguyen
*Attorney, Agent, or Firm*—Christie, Parker & Hale

[57] ABSTRACT

In the atomic force microscopy method, the scanning system modified to provide high-frequency control is set into oscillation by electrical pulses having an amplitude that is adjustable and variable within a wide range. The pulses are so short that contact between the scanning tip and the sample is avoided. The pulse amplitude and/or form are varied in order to generate space charge zones in the semiconductor structures that are shaped differently within wide limits.

9 Claims, 1 Drawing Sheet

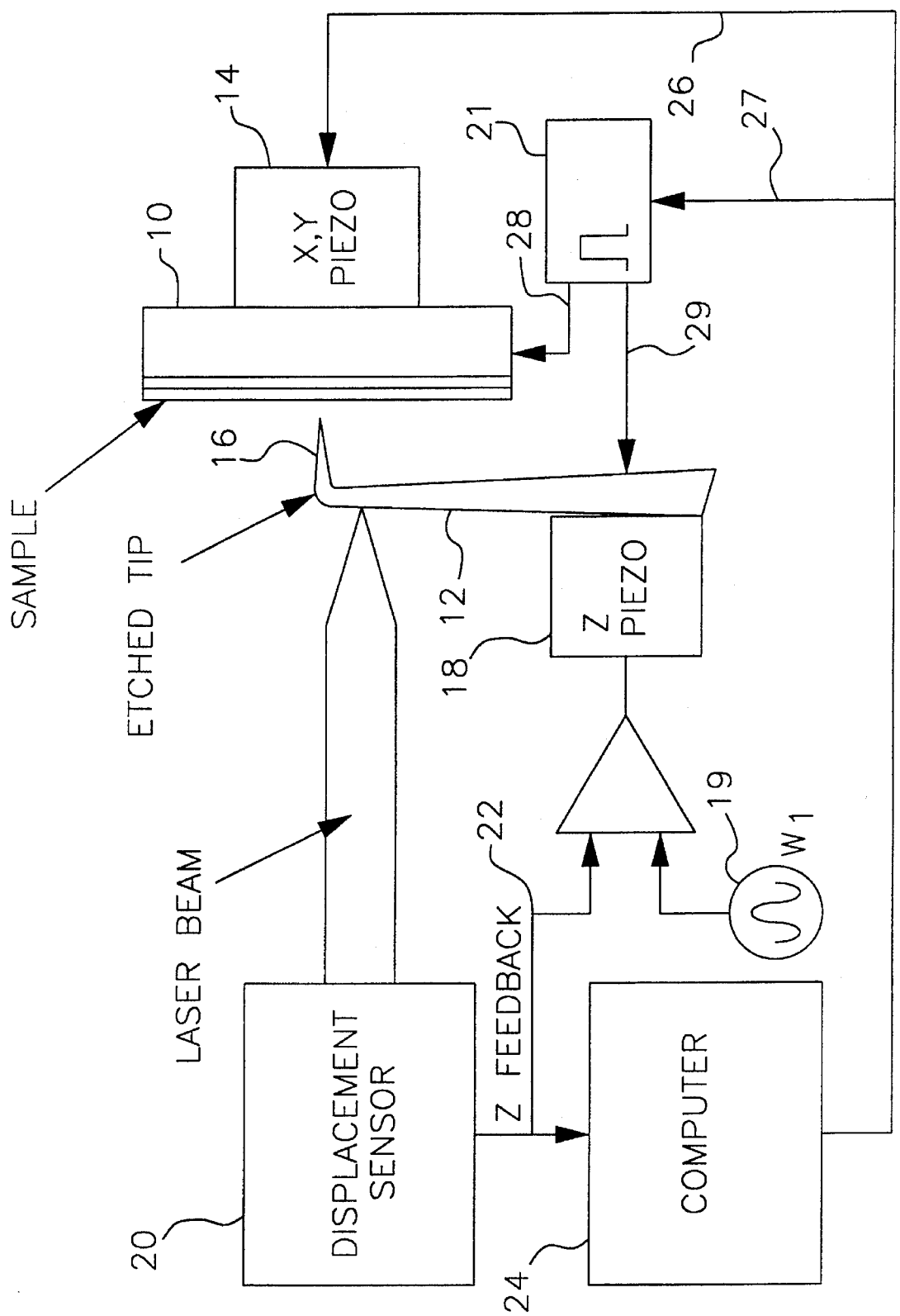

METHOD AND ARRANGEMENT FOR CHARGE CARRIER PROFILING IN SEMICONDUCTOR STRUCTURE BY MEANS OF AFM SCANNING

CROSS-REFERENCE TO RELATED APPLICATION

This is a continuation-in-part of application Ser. No. 08/177,674, filed Jan. 5, 1994, now abandoned.

BACKGROUND OF THE INVENTION

The invention relates to ascertaining the vertical and lateral charge carrier distribution or doping profiles in semiconductor samples, which is generally known as profiling.

For the production of semiconductor components, it is important to know the charge carrier distribution and the variations of dopant concentrations in the semiconductor material. Not only the courses in terms of depth but also the lateral resolution capabilities are of interest. Various methods and equipment have become known for this purpose. Classical profiling methods include SIMS (Secondary Ion Mass Spectrometry), SR (Spreading Resistance), SH (Stripping Hall) and CVM (Capacitance Voltage Method). With the exception of the SR method, the methods have the disadvantage that their lateral resolution is in the millimeter range, which is very coarse. The SR method, in which the measurement is done via a scanning cantilever, has the disadvantage that the contact between the scanning cantilever and the semiconductor to be tested is highly dependent on the material and on the surface property. Maximum mastery of the SR method is achieved only in the testing of silicon samples.

Microscopy methods that work with fine cantilevers are also known. In particular, these are STM (Scanning Tunneling Microscopy), AFM (Atomic Force Microscopy) and SCM (Scanning Capacitor Miscroscopy). In these methods, if the samples are suitably prepared, both lateral and vertical resolutions of a few tenths of a nanometer up to a few tens of nanometers are possible. However, these methods have the disadvantages discussed below.

In STM, scanning is done in a grid pattern over the sample using a fine tip, and the local current/voltage characteristic curve is picked up. If an oblique grind or an edge is being examined, then the work function of the electrons is dependent on the local energy band distortion at the surface, which in turn affects the current/voltage characteristic. The greatest source of error in this method is the absence of direct information about the actual distance between the tip and the sample, so that temperature fluctuations and irregularities can have considerable influence on the current/voltage characteristic curves.

In an AFM scanning arrangement, a scanning wand or cantilever has a scanning tip that in the position of repose is spaced a predetermined distance from the sample. For measurement, the scanning cantilever is set into oscillation, at one of its possible resonant frequencies. The motion of the tip is detected with the aid of a laser that is focused on the reflecting scanning cantilever. Shifting of the resonant frequency as a result of force gradients between the tip and the sample causes variations in the amplitude of the oscillation, which are utilized in an optical feedback loop to keep the tip-to-sample spacing constant.

To use the AFM arrangement as a profiler, it is known (from M. P. Boyle et al, Advances in Dopant Profiling by Atomic Force Microscopy; Proceedings of the First International Workshop on the Measurement and Characterization of Ultra-Shallow Doping Profiles in Semiconductors, 1991, and J. Vac. Sci. Technol. B, Vol. 9, 1991, No. 2, 703–706) to apply a low direct voltage of from 1 to 2 V to the tip; superimposed on this is an alternating voltage of a few hundred millivolts, in order to set the tip into mechanical oscillation at another resonant frequency of the scanning cantilever. (The disclosure of the Boyle et al article is incorporated herein fully by reference.) As a result, the surface space charge zone, which is normally always present, is modulated about its state of equilibrium, and a differential capacitance is thus generated.

Measuring this variable makes it possible to determine only the near-surface doping for maximally homogeneously doped semiconductors. Another disadvantage of the previously known achieved embodiment of this method is that until now there have been no suitable evaluation algorithms. The simplified assumptions of a plate capacitor cause considerable error.

SUMMARY OF THE INVENTION

The invention seeks to attain a lateral resolution of several tens of a nanometer and a depth resolution in the subnanometer range in charge carrier profiling; the measurement results should be evaluatable without difficulties.

According to the invention, this is attained, in a method for charge carrier profiling in semiconductor structures in which as in AFM (Atomic Force Microscopy) a scanning tip located on a scanning cantilever, which tip and cantilever form the scanning system, is first adjusted to a predetermined distance from a sample to be examined, in which the scanning system is electrically conductive and the tip distortion is measured with an optical arrangement, in that the scanning system embodied for high-frequency control is set into oscillation by electric pulses. The pulses are so short that contact between the scanning tip and the sample is avoided. The amplitude of the pulses is adjustable and variable within a wide range. To generate space charge zones that are variously embodied within wide limits in the semiconductor structures, the pulse amplitude and pulse shape are varied.

The short pulses are in the range from a few nanoseconds to a few tens of microseconds. By using such short pulses, the varying time performance of the scanning system and the space charge zone are utilized for determining the charge carrier profile. The time constants characterized for the dynamic performance of the space charge zone and of the scanning system vary widely. The range of maximum pulse amplitude can therefore extend, depending on the pulse duration, from a few volts to into the 100-volt range. Even with such a high voltage, the scanning system starts to oscillate for only a short time period, without causing a danger of contact between the scanning tip and the sample to be examined. On the other hand, the space charge zone extends to a substantially greater depth than with lower voltages.

BRIEF DESCRIPTION OF THE DRAWING

The single figure of the drawing depicts an AFM scanning arrangement that is used to practice the invention.

DETAILED DESCRIPTION OF THE INVENTION

As shown in the drawing, a semiconductor sample under test 10 is positioned between a tungsten wire etched cantilever 12 and a piezoelectric scanning device 14, which moves sample 10 in a plane parallel to the surface of cantilever 12. Cantilever 12 has a right angle tip 16 which is spaced a short distance from sample 10. (The spacing is exaggerated in the drawing for purposes of illustration.) Tip 16 is vibrated at one of its resonant frequencies $\omega_1$ by a piezoelectric transducer 18 that is excited by pulses from an alternating electrical source 19. Transducer 18 is provided for position control of tip 16 in the Z direction, that is, in the direction toward and away from the sample 10. Cantilever 12 is also biased by a computer controlled pulse generator 21. The resultant motion of tip 16 is measured by an optical displacement sensor 20 using a laser beam. Shifts in the resonant frequency due to force gradients between tip 16 and sample 10 cause changes in amplitude of the driven oscillation, which are used in a feedback loop 22 to control the spacing of tip 16 from sample 10. Specifically, a Z feedback signal generated by a lock-in amplifier that is part of displacement sensor 20 is coupled from sensor 20 to an amplifier 23 which provides the Z direction control to transducer 18. Source 19 provides an additional signal to amplifier 23 to enable vibration perpendicular to the surface to maintain a constant gap. Tip 16 vertically vibrating at a frequency $\omega_1$ is brought in close proximity to sample 10. The amplitude of the vibration is modified by the forces between tip and sample. The reflected laser beam from tip 16 and the lock in amplifier measure the ampltude of the vibration and send the Z feedback to transducer 18, which causes the vertical position of tip 16 to be moved until the amplitude of the vibration is at the desired level. As tip 16 is scanned across the surface, the reflected laser beam, the lock in amplifier, and the Z feedback 22 act to maintain the vibrational amplitude constant. This condition of constant amplitude is in general found to be equivalent to keeping a constant gap between tip 16 and sample 10. The output of sensor 20 is also fed to a computer 24 to form contours of constant force gradients. Computer 24 also controls the movement of scanning device 14 through an electrical connection 26 and controls the pulse characteristics of pulse generator 21 through an electrical connection 27.

The pulses generated by source 21 are so short that contact between scanning tip 16 and sample 10 is avoided. The amplitude of the pulses generated by source 21 is adjustable and variable within a wide range. To generate space charge zones that are variously embodied within wide limits in the semiconductor structures, the characteristics of the pulses from source 21, namely, pulse amplitude and/or pulse shape, are varied by computer 24 as represented by connection 27.

Pulses from pulse generator 21 are applied to sample 10 through a connection 28 and to cantilever 12 through a connection 29.

The oscillation amplitudes are directly proportional to the electrical forces acting upon the scanning tip, which in turn result from the space charge zones in the semiconductor that are induced by the control pulses applied by source 21. As a result of the variously embodied space charge zones, a vertical doping profile down to a depth of several hundred nanometers can be ascertained.

The pulse shape of source 21 can be arbitrary. A predetermined motion spectrum of the scanning tip can be generated purposefully by means of different pulse shapes.

It is practical for the pulses to be applied by source 21 at the zero crossover of the scanning tip. The zero crossover is equivalent to the previously set position of repose of the scanning tip. This makes evaluation of the measurement easier.

With this method, it is possible to scan the doping profile of a semiconductor sample down to a depth of several hundred nanometers. The lateral resolution is between several tens of nanometers and a maximum of 300 nm. It is thus possible to characterize modern wafers having selectively ion-implanted islets. If pn junctions or hetero-junctions are located at a depth, then they must be exposed by oblique grinding or cleaning.

The method can be carried out with an arrangement that has AFM scanning to which a pulse generator is added to generate the pulses described above. The AFM arrangement has a conventional scanning system modified for electric high-frequency control.

The modification of the conventional scanning system essentially comprises providing it, for the purposes of high-frequency control, with a low-capacitance and low-inductance coaxial line or stripline with a defined termination to feed the high frequency pulses thereto.

Since AFM scanning is used, surface profiling as with a known atomic force microscope is fundamentally possible with this arrangement.

The disclosure of attached German patent application P 43 00 504.9-33, filed on Jan. 5, 1993 is incorporated fully herein by reference. Priority of this German application is claimed.

What is claimed is:

1. A method for charge carrier profiling in semiconductor structures by means of an electrically conductive AFM scanning system having a scanning tip on a support cantilever, the method comprising the steps of:

spacing the tip while stationary a predetermined distance from the surface of a semiconductor structure under examination;

setting the scanning system into oscillation with high frequency electrical pulses generated by a pulse generator connected to the cantilever and the structure under examination, the pulses having a duration that is sufficiently short to avoid contact with the surface of the structure under examination; and varying a characteristic of the pulses to generate in the structure under examination space charge zones that are differently shaped.

2. The method of claim 1, in which the varying step varies the amplitude of the pulses.

3. The method of claim 2, in which the varying step varies the form of the pulses.

4. The method of claim 1, in which the varying step varies the form of the pulses.

5. The method of claim 1, in which the pulses are in the range from a few nanoseconds to a few tens of microseconds.

6. The method of claim 1, in the range of maximum pulse amplitude extends from a few volts up to 100 volts.

7. The method of claim 1, in which the pulses are applied at the zero crossover of the tip oscillations.

8. The method of claim 1, additionally comprising the step of optically detecting movement of the tip of the scanning system.

9. The method of claim 1, in which the pules generator is controlled by a computer.

* * * * *

UNITED STATES PATENT AND TRADEMARK OFFICE
CERTIFICATE OF CORRECTION

PATENT NO. : 5,517,128
DATED : May 14, 1996
INVENTOR(S) : Uwe Henninger

It is certified that error appears in the above-indentified patent and that said Letters Patent is hereby corrected as shown below:

Column 3, line 31, change "ampltude" to -- amplitude --.

Column 4, line 39, after "scanning" replace "system" with -- tip --.

Column 4, line 64, change "pules" to -- pulse --.

Signed and Sealed this

Tenth Day of September, 1996

*Attest:*

BRUCE LEHMAN

*Attesting Officer*     *Commissioner of Patents and Trademarks*